(12) United States Patent
Seon et al.

(10) Patent No.: US 8,252,386 B2
(45) Date of Patent: Aug. 28, 2012

(54) METHOD FOR FORMING UV-PATTERNABLE CONDUCTIVE POLYMER FILM

(75) Inventors: Jong Baek Seon, Seoul (KR); Young Gwan Lee, Seoul (KR); Jung Seok Hahn, Seongnam-si (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 883 days.

(21) Appl. No.: 12/076,959

(22) Filed: Mar. 26, 2008

(65) Prior Publication Data
US 2008/0241549 A1 Oct. 2, 2008

(30) Foreign Application Priority Data

Mar. 26, 2007 (KR) .................. 10-2007-0029179

(51) Int. Cl.
*C08F 2/46* (2006.01)
*C08J 7/18* (2006.01)

(52) U.S. Cl. ........ 427/487; 427/488; 427/497; 427/504; 427/508; 427/509; 427/510

(58) Field of Classification Search .................. 427/487, 427/488, 497, 504, 508, 509, 510
See application file for complete search history.

(56) References Cited

U.S. PATENT DOCUMENTS

| 5,554,710 | A * | 9/1996 | Mori et al. ............. 528/32 |
| 5,968,674 | A * | 10/1999 | Hsieh et al. ............. 428/690 |
| 7,459,519 | B2 * | 12/2008 | Yoshida ............. 528/482 |
| 2003/0161968 | A1 * | 8/2003 | Wang et al. ............. 427/569 |
| 2006/0214156 | A1 * | 9/2006 | Pan et al. ............. 257/40 |
| 2006/0269664 | A1 * | 11/2006 | Gleason et al. ............. 427/248.1 |
| 2007/0196643 | A1 * | 8/2007 | Park et al. ............. 428/323 |
| 2008/0118669 | A1 * | 5/2008 | Inoue et al. ............. 428/1.31 |
| 2009/0114430 | A1 * | 5/2009 | Kim ............. 174/257 |

FOREIGN PATENT DOCUMENTS

JP  2005-259544  * 9/2005

OTHER PUBLICATIONS

Winther-Jensen, Bjorn, et al., "Vapor-Phase Polymerization of 3,4-Ethylenedioxythiophene: A Route to Highly Conducting Polymer Surface Layers". Macromolecules 2004, 37, 4538-4543.*
Kim, Jeonghun, et al., "Flexible Conductive Polymer Patterns from Vapor Polymerizable and Photo-Cross-Linkable EDOT". Macromolecules 2010, 43, 2322-2327.*
Kim, Jinyeol, et al., "Fabrication and characterization of conductive polypyrrole thin film prepared by in situ vapor-phase polymerization". Synthetic Metals 132 (2003) 309-313.*

* cited by examiner

*Primary Examiner* — Bret Chen
(74) *Attorney, Agent, or Firm* — Harness, Dickey & Pierce, P.L.C.

(57) ABSTRACT

According to a method for forming a UV patternable conductive polymer film, vapor-phase polymerization (VPP) may be employed to synthesize a conductive polymer, and a UV-curable polymer resin may be used as a binder to form a conductive polymer film, the method including coating a mixed solution of a binder and an oxidant on a transparent substrate, synthesizing a conductive polymer by vapor-phase polymerization (VPP) on the coating to form a conductive polymer film and patterning the conductive polymer film with UV light. The conductive polymer film may be patterned in a relatively simple manner while maintaining increased conductivity, improved transparency and improved flexibility. Therefore, the conductive polymer film may be used as a material for transparent electrodes of a variety of display devices, e.g., LCD and PDP devices, and electronic devices, e.g., ELs and TFTs.

13 Claims, 2 Drawing Sheets

METHOD FOR FORMING UV-PATTERNABLE CONDUCTIVE POLYMER FILM

PRIORITY STATEMENT

This application claims priority under U.S.C. §119 to Korean Patent Application No. 10-2007-0029179, filed on Mar. 26, 2007, in the Korean Intellectual Property Office (KIPO), the entire contents of which are incorporated herein by reference.

BACKGROUND

1. Field

Example embodiments relate to a method for forming a UV-patternable conductive polymer film and a conductive polymer film formed by the method. Other example embodiments relate to a method for forming a UV-patternable conductive polymer film in which vapor-phase polymerization (VPP) may be employed to synthesize a conductive polymer and a UV-curable polymer resin may be used as a binder to form a conductive polymer film capable of being patterned in a relatively simple manner while maintaining increased conductivity, improved transparency and improved flexibility, and a conductive polymer film formed by the method.

2. Description of the Related Art

Recent successful development of digital broadcasting services and increasing demand for high-resolution large-area displays have led to the popularization of flat panel displays, e.g., liquid crystal displays (LCDs) and plasma display panels (PDPs). Digital multimedia broadcasting (DMB) services, e.g., satellite DMB and terrestrial DMB based on the convergence of broadcasting and communications, may be already available, and ubiquitous computing may become feasible. Flexible displays may be next-generation displays capable of replacing existing TFT-LCDs, PDPs and organic ELs.

Such flexible displays require the use of electrode materials that may be transparent, have relatively low resistance and exhibit increased strength so as to be mechanically stable even while being bent or folded. Further, the electrode materials may have improved adhesion to plastic substrate materials and improved chemical resistance to a variety of organic solvents. Furthermore, if the electrode materials are patterned into various shapes while maintaining improved adhesion to plastic substrates, simplification of the manufacturing process and a reduction in the manufacturing cost of flexible displays may be achieved.

Indium tin oxide (ITO) may be used as an electrode material for the fabrication of a variety of display devices, including flexible display devices. However, the use of ITO may result in increased cost and undesirable mechanical properties despite the advantages of improved transparency and increased conductivity on plastic substrates. In addition, etching may be the only method for the formation of circuits using ITO. In recent years, considerable research efforts have been directed toward the development of conductive polymers as electrode materials for flexible displays that exhibit improved characteristics in terms of flexibility, adhesiveness, thermal expansion and printability and that may be in harmony with plastic substrates in terms of physical properties.

Patterning may be a very important technique for the formation of organic electrodes using conductive polymers. A conventional technique for patterning a conductive polymer film for a flexible display device may be carried out by the following procedure. A conductive polymeric material may be coated on a transparent substrate to form a conductive polymer film. For example, the coating may be conducted by spin coating. A photoresist composition may be applied to the conductive polymer film, followed by exposing/etching to form a pattern. However, this photoresist process may be complicated and may use expensive equipment, incurring considerable cost.

Inkjet printing-based patterning may have advantages from the standpoint of ease of processing and cost-effectiveness, but still needs further improvements, for example, in the viscosity and pH adjustment of conductive polymers as ink materials, the development of printing heads and the adhesion of conductive polymers to plastic substrates.

SUMMARY

Example embodiments provide a method for forming a UV-patternable conductive polymer film in which vapor-phase polymerization (VPP) may be employed to synthesize a conductive polymer, and a UV-curable polymer resin may be used as a binder to form a conductive polymer film capable of being patterned in a relatively simple manner while maintaining increased conductivity, improved transparency and improved flexibility.

Example embodiments also provide a method for forming a conductive polymer film that may be patterned with UV light in a relatively simple manner and may have improved adhesion to a substrate. Example embodiments also provide a conductive polymer film that may be patterned with UV light in a relatively simple manner while maintaining increased conductivity, improved transparency and improved flexibility.

BRIEF DESCRIPTION OF THE DRAWINGS

Example embodiments will be more clearly understood from the following detailed description taken in conjunction with the accompanying drawings.

FIG. 1 is a graph showing variations in the surface resistance of a conductive polymer film formed in Example 1 as a function of polymerization time according to example embodiments;

FIG. 2 is a graph showing variations in the transmittance of a conductive polymer film formed in Example 1 as a function of polymerization time according to example embodiments; and FIG. 3 is a graph showing variations in the transmittance of conductive polymer films formed Examples 1 to 4 with varying ratios between a binder and an oxidant according to example embodiments.

Figure 1:
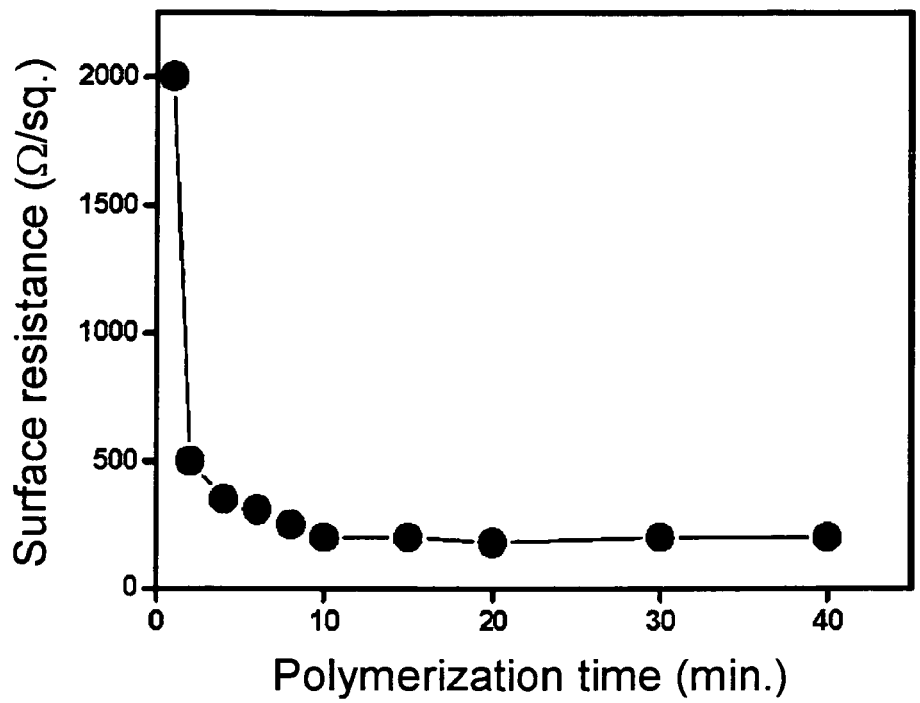
FIGS. 1 to 3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail with reference to the attached drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments provide a method for forming a conductive polymer film, the method including coating a mixed solution of a binder and an oxidant on a transparent substrate, synthesizing a conductive polymer by vapor-phase polymerization (VPP) on the coating to form a conductive polymer film, and patterning the conductive polymer film with UV light. The vapor-phase polymerization for the synthesis of the conductive polymer may render the conductive polymer film more uniform and may increase the adhesion of the conductive polymer film to the substrate while maintaining increased electrical conductivity and improved transparency. The use of a UV-curable polymer resin as the binder may enable the patterning of the conductive polymer film in a relatively simple manner without requiring any additional photoresist process.

Example embodiments also provide a conductive polymer film, which may be formed by the method, that may be patterned with UV light in a relatively simple manner while maintaining increased conductivity, improved transparency and improved flexibility. A more detailed explanation of the respective steps of the method according to example embodiments will now be provided.

The method of example embodiments may include coating a mixed solution of a binder and an oxidant on a transparent substrate, synthesizing a conductive polymer by vapor-phase polymerization on the coating to form a conductive polymer film, and patterning the conductive polymer film with UV light and washing unreacted oxidant remaining after the patterning.

A binder may be mixed with an oxidant to prepare a mixed solution. The mixed solution may be coated on a transparent substrate. The transparent substrate may be surface-treated by $O_2$ plasma. This plasma treatment may make the surface hydrophilic to increase the adhesion of the substrate surface to a final conductive polymer film to be formed thereon. Any known coating technique may be employed to coat the mixed solution on the transparent substrate, and examples thereof may include spraying, spin coating, dipping, printing, doctor blading and sputtering. The coated transparent substrate may be dried in a drier at about 50° C.-about 100° C. for about 1 minute-about 10 minutes to remove a solvent, which may be used to dissolve the binder.

The transparent substrate may be of any type so long as it is transparent. The transparent substrate may be a transparent inorganic substrate, e.g., a glass or quartz substrate, or a transparent plastic substrate made of a material selected from the group consisting of polyethylene terephthalate (PET), polyethylene naphthalate (PEN), polycarbonate (PC), polystyrene (PS), polypropylene (PP), polyimide (PI), polyethylene sulfonate (PES), polyoxymethylene (POM), acrylonitrile-styrene (AS) resins and acrylonitrile-butadiene-styrene (ABS) resins, for example, a flexible substrate. The transparent substrate may have a transmittance of at least 70%, for example, at least 80%, in the visible wavelength range of about 400 nm to about 750 nm.

The binder may serve to provide an adhesive force between the substrate and the final conductive polymer film and enable the patterning of the conductive polymer film with UV light. The binder may be selected from UV-curable polymer resins. Specific examples of suitable binder resins may include, but are not limited to, polyester acrylate resins and epoxy acrylate resins, e.g., an epoxy acrylate resin. The binder may be dissolved in an appropriate organic solvent. For example, the organic solvent may be selected from the group consisting of, but not necessarily limited to, methyl alcohol, butyl alcohol, ethyl cellosolve, ethyl alcohol, cyclohexane, acetone, ethyl acetate, toluene, methyl ethyl ketone and mixtures thereof.

The oxidant may be selected from the group consisting of ferric toluene sulfate (FTS), $CuCl_3$, $FeCl_3$, $Cu(ClO_4)_2 \cdot 6H_2O$, $AuCl_3$, $MgCl_2$, $Fe(ClO_4)_3$, $NiCl_2$, $H_2PtCl_5 \cdot 6H_2O$, $Na_2PdCl_4$, $CuCl_2$, iron dodecyl benzene sulfonate, iron anthraquinone sulfonate, and $(HAuC_4 \cdot 4H_2O)AgNO_3$, for example, FTS. The mixing weight ratio of the binder to the oxidant may be about 1:1 to about 1:1,000, for example, about 1:5 to about 1:100. A photoinitiator may be added to the mixed solution of the binder and the oxidant. The photoinitiator may be, for example, an acetophenone, benzophenone, thioxanthone, benzoin or triazine compound. A dopant may be added to the mixed solution to control the conductivity of the final conductive polymer film through doping.

A monomer of a conductive polymer may be vaporized and may be in contact with the coated substrate. This contact may cause polymerization of the monomer with the oxidant on the surface of the substrate, leaving a conductive polymer film. Examples of suitable monomers for use in the method of example embodiments may include, but are not necessarily limited to, pyrrole, thiophene, furan, selenophene, 2,3-dihydrothio-3,4-dioxin and their derivatives, for example, 3,4-ethylenedioxythiophene (EDOT).

The monomer may be vaporized, dispersed in contact with the coated substrate and polymerized with the oxidant in a vapor-phase polymerization chamber. As a result, a uniform conductive polymer film may be formed. The reaction temperature in the vapor-phase polymerization chamber may be maintained at about 30° C.-about 120° C., for example, about 50° C.-about 100° C., for about 1 minute-about 5 minutes.

A patterned mask may be placed on the conductive polymer film and irradiated with UV to pattern the conductive polymer film. No particular limitation may be imposed on the patterning of the conductive polymer film by UV irradiation. The UV irradiation may be continued for about 3 minutes-about 6 minutes. Portions of the conductive polymer film unexposed to UV light may not be uncured by UV irradiation and may be thus dissolved with a developing solution to leave a desired pattern on the conductive polymer film.

After the UV irradiation, unreacted oxidant remaining on the conductive polymer film may be removed by washing with an organic solvent and distilled water, followed by drying, therefore completing the formation of the patterned conductive polymer film that may be highly transparent, flexible and conductive. The conductive polymer film may be used as a material for transparent electrodes of a variety of display devices (e.g., LCD and PDP devices) and electronic devices (e.g., ELs and TFTs).

Hereinafter, example embodiments will be described in detail with reference to Examples. These Examples are set forth to illustrate example embodiments, but should not be construed as the limit of example embodiments.

EXAMPLES

Example 1

Coating of Mixed Solution of Binder and Oxidant

First, about 100 μm thick PET film (area: 6 cm×6 cm) as a transparent substrate was treated by $O_2$ plasma under the following conditions: about 100 W, about 1 sccm, about 0.178 torr, about 1 min. This plasma treatment was conducted to improve the adhesion of the substrate surface to a final conductive polymer film to be formed thereon.

Subsequently, about 40 wt % of FTS as an oxidant was dissolved in butanol and an epoxy acrylate resin as a binder was added thereto until the weight ratio of the binder to the oxidant reached about 1:10 to prepare a mixed solution. The plasma-treated substrate was spin-coated with the mixed solution in the order of about 300 rpm/7 s→about 2,000 rpm/30 s,→about 500 rpm/23 s. The coated substrate was dried in an oven at about 80° C. for about 30 minutes to remove the remaining solvent.

Formation of Conductive Polymer Film

The substrate coated with the binder and the oxidant was introduced into a vapor-phase polymerization chamber and exposed to vapor-phase 2,3-ethylenedioxythiophene (EDOT) as a monomer at about 50° C. for about 2-3 minutes to polymerize the monomer. As a result, a conductive polymer film may be formed.

Patterning of the Conductive Polymer Film

A patterned mask was placed on the conductive polymer film, followed by UV irradiation. The UV irradiation was performed using a UV lamp at about 1,000 W with a maximum wavelength of about 365 nm for about 3-6 minutes while maintaining the distance between the substrate and the UV lamp constant (about 25 cm). The exposed conductive polymer film was washed with butanol and distilled water, and dried to form a pattern of the conductive polymer film.

Example 2

A patterned conductive polymer film was formed in the same manner as in Example 1 except that the ratio of the binder and the oxidant was about 1:20.

Example 3

A patterned conductive polymer film was formed in the same manner as in Example 1 except that the ratio of the binder and the oxidant was about 1:30.

Example 4

A patterned conductive polymer film was formed in the same manner as in Example 1 except that the ratio of the binder and the oxidant was about 1:40.

Measurement of Transmittance and Electrical Resistance

Figure 2:
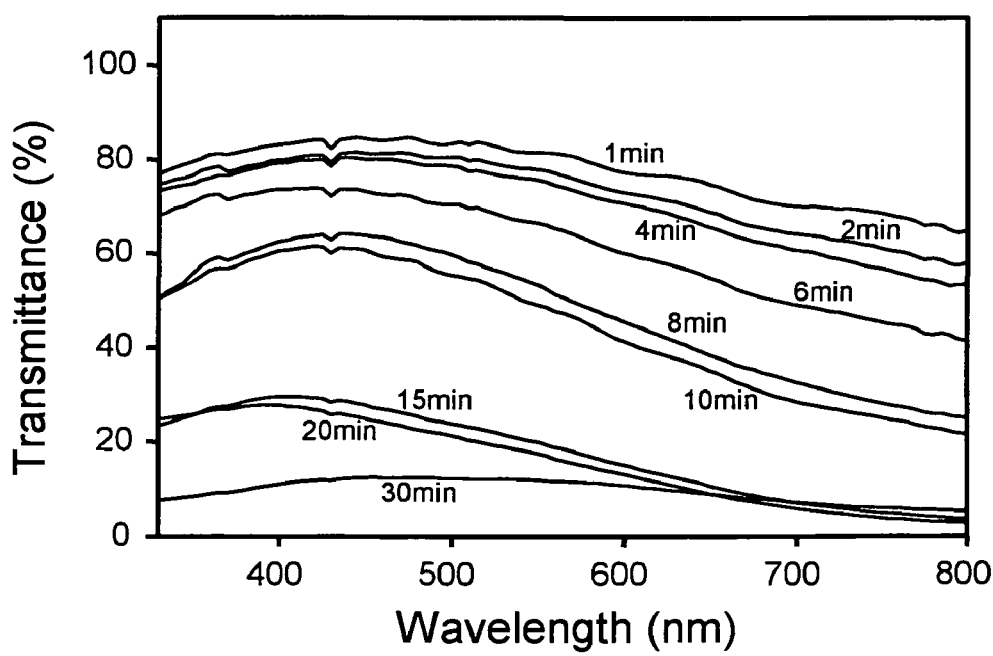

The variations in the surface resistance and the UV transmittance of the conductive polymer film formed in Example 1 were measured as a function of polymerization time, and the results are shown in FIGS. 1 and 2, respectively.

As shown in FIG. 1, the surface resistance of the conductive polymer film began to steeply decrease until about 10 minutes after the initiation of the polymerization, and thereafter, no dramatic decrease was observed. After about 20 minutes, the surface resistance of the conductive polymer film reached a maximum of about 150 Ω/sq.

The graph of FIG. 2 shows that the transmittance of the conductive polymer film decreased with increasing polymerization time. Therefore, the polymerization time may be a critical factor in optimizing or increasing the transmittance and electrical resistance of the film. The conductive polymer films formed in Examples 1 to 4 showed a conductivity of about 200 S/cm and a transmittance of about 85% or above at a polymerization time of about 2-3 minutes.

Figure 3:
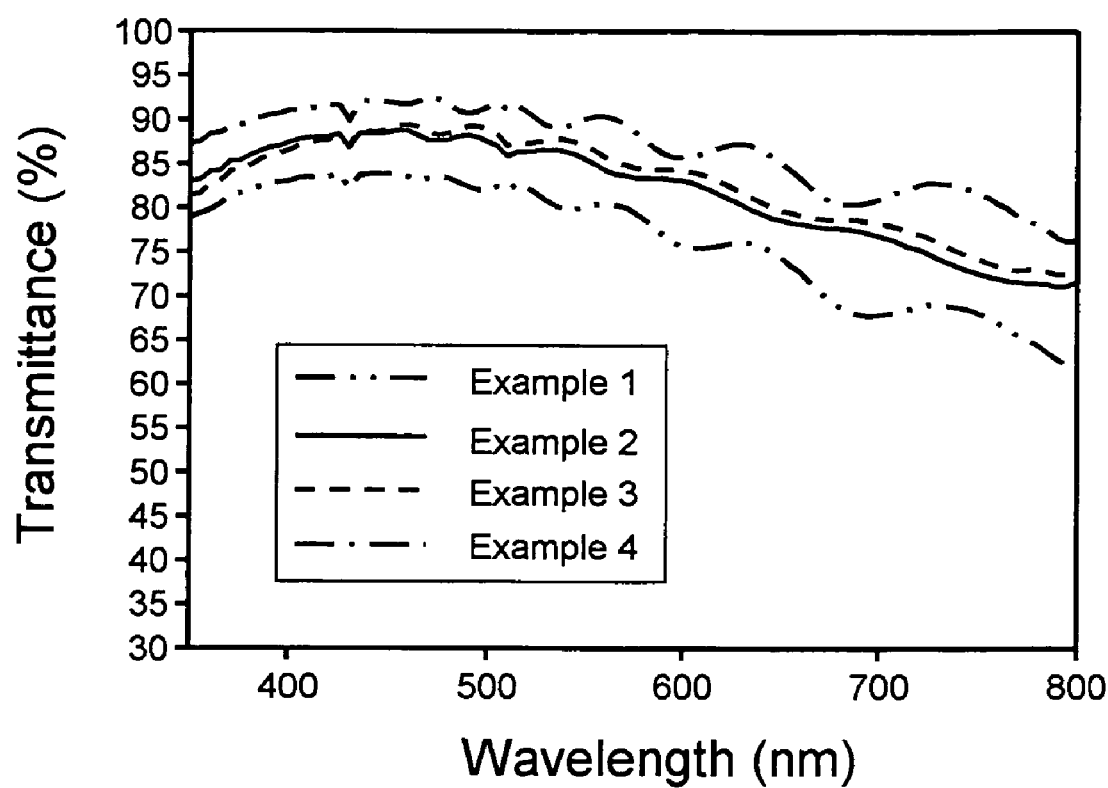

The UV-transmittance of each of the conductive polymer films formed in Examples 1 to 4 was measured, and the results are shown in FIG. 3. The surface resistance and the UV-transmittance were measured using a four-point probe (ammeter: Keithley 236 and voltmeter: Keithley 617) and a UV-Visible spectrophotometer (HP-6452).

As apparent from the above description, according to the method of example embodiments, vapor-phase polymerization may be employed to effectively form a more uniform polymer film, so that increased electrical conductivity and improved transparency of the polymer film may be maintained. In addition, a UV-curable polymer resin may be used as a binder in the method of example embodiments to enable the formation of a pattern without the need for an additional photoresist, thus contributing to the simplification and cost effectiveness of the method. Furthermore, a conductive polymer film formed by the method of example embodiments may be patterned in a relatively simple manner while maintaining increased conductivity, improved transparency and improved flexibility.

Example embodiments have been described in detail; however, example embodiments are not limited thereto. Those skilled in the art will appreciate that various modifications and variations may be possible, without departing from the scope and spirit of the appended claims.

What is claimed is:

1. A method for forming a conductive polymer film, the method comprising:
   coating a mixed solution of a photosensitive polymer resin and an oxidant on a transparent substrate without the use of an additional binder;
   synthesizing a conductive polymer by vapor-phase polymerization (VPP) on the coating to form a conductive polymer film; and
   patterning the conductive polymer film with UV light,
   wherein the photosensitive polymer resin is selected from the group consisting of polyester acrylate resins and epoxy acrylate resins.

2. The method according to claim 1, wherein the oxidant is selected from the group consisting of ferric toluene sulfate (FTS), $CuCl_3$, $FeCl_3$, $Cu(ClO_4)_2.6H_2O$, $AuCl_3$, $MgCl_2$, $Fe(ClO_4)_3$, $NiCl_2$, $H_2PtCl_5.6H_2O$, $Na_2PdCl_4$, $CuCl_2$, iron dodecyl benzene sulfonate, iron anthraquinone sulfonate, and $(HAuCl_4.4H_2O)AgNO_3$.

3. The method according to claim 1, wherein the photosensitive polymer resin is mixed with the oxidant in a weight ratio of about 1:5 to about 1:100.

4. The method according to claim 1, wherein the transparent substrate is a flexible substrate.

5. The method according to claim 1, wherein the transparent substrate is surface-treated by $O_2$ plasma.

6. The method according to claim 1, wherein the mixed solution further contains a dopant.

7. The method according to claim 1, wherein the conductive polymer is synthesized by vaporizing a monomer and bringing the monomer vapor into contact with the coated substrate to cause polymerization of the monomer with the oxidant on the surface of the substrate.

8. The method according to claim 7, wherein the monomer is selected from the group consisting of pyrrole, thiophene, furan, selenophene, 2,3-dihydrothio-3,4-dioxin and their derivatives.

9. The method according to claim 7, wherein the monomer is 3,4-ethylenedioxythiophene.

10. The method according to claim 1, wherein the vapor-phase polymerization is performed for about 2-about 3 minutes.

11. The method according to claim 1, wherein the vapor-phase polymerization is performed at a temperature of about 50° C.-about 100° C.

12. The method according to claim 1, wherein the UV patterning is performed by UV irradiation at a wavelength of about 365 nm for about 3-about 6 minutes.

13. The method according to claim 1, wherein patterning the conductive polymer film with UV light further includes washing unreacted oxidant remaining after the patterning.

* * * * *